United States Patent [19]

Yoshida

[11] Patent Number: 5,480,533

[45] Date of Patent: Jan. 2, 1996

[54] MICROWAVE PLASMA SOURCE

[75] Inventor: Yoshikazu Yoshida, Izumi, Japan

[73] Assignee: Matsushita Electric Industrial Co., Ltd., Osaka, Japan

[21] Appl. No.: 415,746

[22] Filed: Apr. 3, 1995

Related U.S. Application Data

[63] Continuation of Ser. No. 924,932, Aug. 5, 1992, abandoned.

[30] Foreign Application Priority Data

| Aug. 9, 1991 | [JP] | Japan | 3-200639 |
| Mar. 31, 1992 | [JP] | Japan | 4-076455 |

[51] Int. Cl.$^6$ .................................................. C23C 14/34
[52] U.S. Cl. ........................... 204/298.19; 204/298.16; 204/298.38
[58] Field of Search ............... 156/345; 204/192.12, 204/298.02, 298.16, 298.19, 298.38; 315/111.21, 111.41, 111.71, 111.81; 118/723

[56] References Cited

U.S. PATENT DOCUMENTS

| 4,339,326 | 7/1982 | Hirose et al. . | |
| 4,563,240 | 1/1986 | Shibata et al. . | |
| 4,581,100 | 4/1986 | Hatzakis et al. . | |
| 4,721,553 | 1/1988 | Saito et al. . | |
| 4,761,219 | 8/1988 | Sasaki et al. . | |
| 4,877,509 | 10/1989 | Ogawa et al. | 204/298.38 X |
| 4,880,515 | 11/1989 | Yoshikawa et al. . | |
| 4,982,138 | 1/1991 | Fujiwara et al. | 204/298.38 X |
| 4,985,109 | 1/1991 | Otsubo et al. | 204/298.38 X |
| 4,990,229 | 2/1991 | Campbell et al. . | |
| 5,003,152 | 3/1991 | Matsuo et al. | 204/298.38 X |
| 5,022,977 | 6/1991 | Matsuoka et al. . | |
| 5,024,716 | 6/1991 | Sato . | |
| 5,034,086 | 7/1991 | Sato . | |
| 5,230,784 | 7/1993 | Yoshida | 204/298.16 X |
| 5,234,565 | 8/1993 | Yoshida | 204/298.34 X |

FOREIGN PATENT DOCUMENTS 56-13480 7/1979 Japan .
56-37311 7/1979 Japan .

OTHER PUBLICATIONS

"Electron Cyclotron Resonance Plasma Deposition Technique Using Raw Material Supply by Sputtering", Toshiro Ono et al., Japanese Journal of Applied Physics, vol. 23, No. 8, Aug. 1984, pp. L534–536.

"Ohyo–butsuri" vol. 57, 1988, Shigetomi Matsuoka et al., pp. 1301–1313.

Review of Scientific Instruments, Yoshikazu Yoshida, vol. 62, No. 6, Jun. 1991, "Plasma Properties in the Open–Ended Region of a Coaxial–Type Microwave Cavity," pp. 1498–1503.

Primary Examiner—Nam Nguyen
Attorney, Agent, or Firm—Wenderoth, Lind & Ponack

[57] ABSTRACT

A microwave plasma source includes a microwave source, a rectangular cavity resonator having the microwave source, mounted thereto a coaxial tube connected with the resonator, the coaxial tube having an outer conductor and an inner conductor having inner and outer door-knob-shaped portions at first ends thereof, respectively. Each of the inner and outer door-knob-shaped portions has an opening at the end. The inner conductor is fitted into the resonator in parallel with a direction of an electric field in the resonator, and has a flat portion at the end of the inner door-knob-shaped portion thereof. A glass plate for passing the microwave therethrough and for vacuum sealing is arranged between the inner conductor and the outer conductor and, vacuum chamber connects with the opening of the outer conductor, and is provided with a gas inlet port and a gas exhaust port. A target holder, for holding a target, is arranged inside the door-knob-shaped portion of the inner conductor and near the opening thereof and is supported by the conductor tube through an electrical insulating member. A plurality of permanent magnets are coaxially arranged such that the poles thereof are adjacent to each other to form a plurality of circular magnetic tunnels for magnetron discharge on the flat portion of the door-knob-shaped portion of the inner conductor.

11 Claims, 3 Drawing Sheets

MICROWAVE PLASMA SOURCE

This application is a continuation of now abandoned application Ser. No. 07/924,932, filed on Aug. 5, 1992.

BACKGROUND OF THE INVENTION

The present invention relates to a microwave plasma source for forming a film on a target by sputtering in, for example, a semiconductor process technique or a surface treatment.

In a sputtering apparatus, an object on which a thin film is to be formed and a target are accommodated in a vacuum chamber maintained in a vacuum condition, and a voltage is applied to the target to cause a discharge in the vacuum chamber to generate gas ions. The electric field allows the gas ions to be accelerated and collide with the target.

The target atoms liberated from the target are deposited on the surface of the object to form a thin film. The gas ions colliding with the target are generated by supplying inert gas such as argon gas and then causing glow discharge in the vacuum chamber.

Recently, a sputtering apparatus having excellent efficiency in forming a thin film has been provided in which high density plasma generated by orthogonal electromagnetic fields collide with a target. This is called a magnetron sputtering apparatus. In this apparatus, permanent magnets are arranged so that a magnetic field generated perpendicularly to the applied electric field to allow the plasma generated from inert gas to be of high density in accordance with the electromagnetic field. Such a magnetron sputtering apparatus allows the deposition speed of a thin film to become high under a relatively lower gas pressure or a relatively lower applied voltage.

Generally, the amount of the inert gas supplied in the vacuum chamber, i.e. the gas pressure, greatly affects the characteristics of a thin film formed by the sputtering.

The higher the gas pressure becomes, the larger are the amount of gas ions generated in the vacuum chamber.

Thus, the amount of the ions colliding with the target increases and then the deposition speed of the material of the target to the surface of the object, i.e. the efficiency of forming a thin film, becomes higher.

However, high gas pressure causes the amount of impurity mingled in the thin film to increase. The reason for this increase in impurity is that when there is a lot of inert gas in the vacuum chamber, the inert gas is mingled as impurity in the thin film depositing on the surface of the object.

Therefore, it is impossible to increase both the efficiency of forming a thin film and the purity of a thin film in the conventional sputtering apparatus.

SUMMARY OF THE INVENTION

Accordingly, an essential object of the present invention is to provide a microwave plasma source capable of increasing both the efficiency of forming a thin film and the purity of the thin film so as, to improve the quality of the thin film and effectively form the thin film.

In accomplishing these and other objects, according to one aspect of the present invention, there is provided a microwave plasma source comprising:

a microwave source;

a rectangular cavity resonator having the microwave source coupled thereto;

a coaxial tube connected with the resonator, the coaxial tube having an outer conductor and an inner conductor having inner and outer door-knob-shaped portions at first ends thereof, respectively, each of the inner and outer door-knob-shaped portions having an opening at the end of each of the door-knob-shaped portions, the inner conductor being fitted into the resonator in parallel with a direction of an electric field in the resonator, and having a flat portion at the end of the inner door-knob-shaped portion, a glass plate for passing the microwave therethrough and for vacuum sealing being arranged between the inner conductor and the outer conductor;

a vacuum chamber connecting with the opening of the outer conductor, and provided with a gas inlet port and a gas exhaust port;

a target holder, for holding a target, arranged inside the door-knob-shaped portion of the inner conductor and near the opening thereof and supported by the conductor tube through an electrical insulating member; and a plurality of permanent magnets coaxially arranged in the target holder so that the magnets having different poles are adjacent to each other to form a plurality of circular magnetic tunnels for magnetron discharge on the flat portion of the door-knob-shaped portion of the inner conductor.

BRIEF DESCRIPTION OF THE DRAWINGS

These and other objects and features of the present invention will become clear from the following description taken in conjunction with the preferred embodiments thereof with reference to the accompanying drawings in which.

DETAILED DESCRIPTION OF THE PREFERRED EMBODIMENTS

Figure 2:
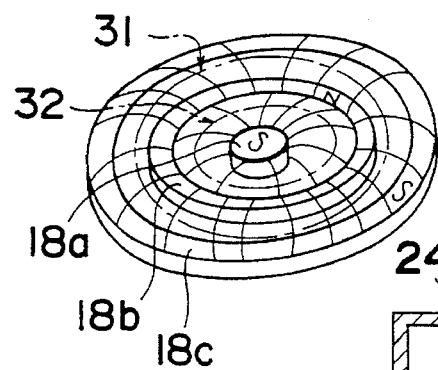
FIG. 2 is a perspective view showing magnetic tunnels of the source in FIG. 1.

Before the description of the present invention proceeds, it is to be noted that like parts are designated by like reference numerals throughout the accompanying drawings.

Figure 1:
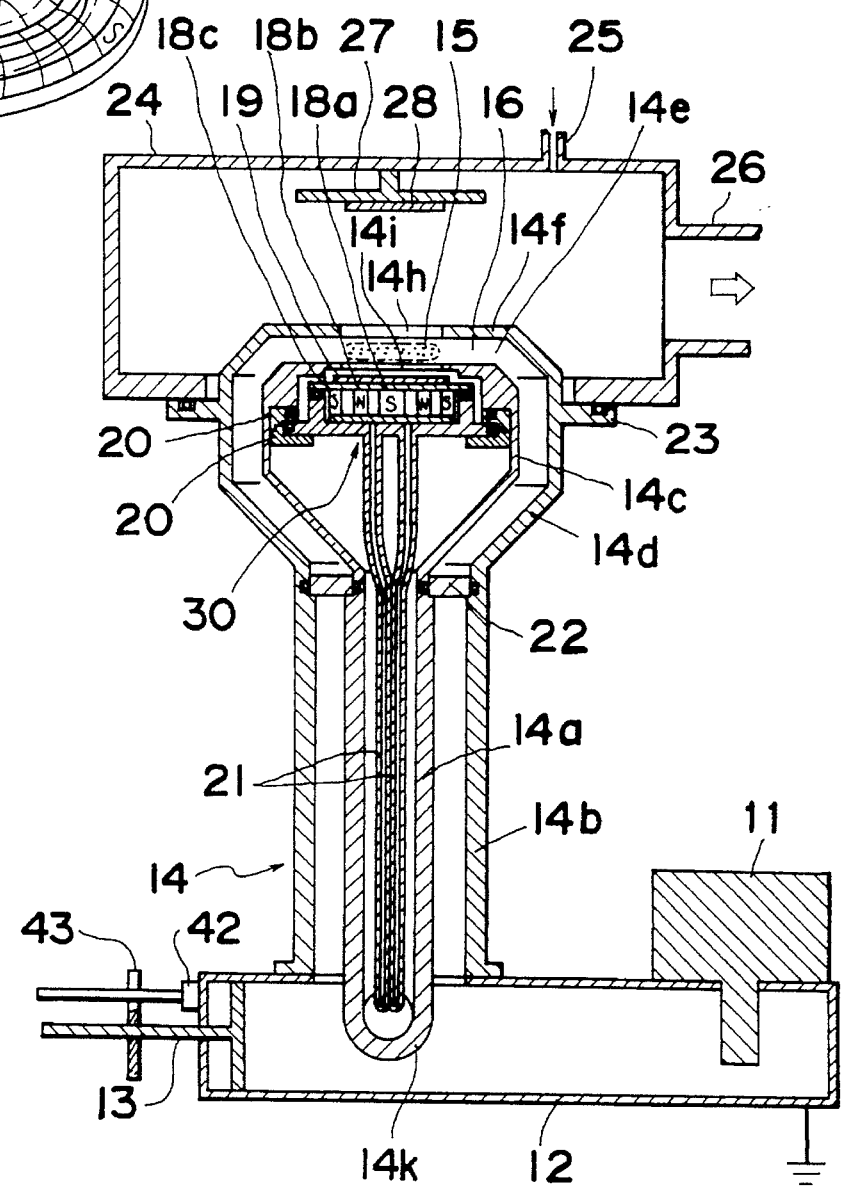
FIG. 1 is a cross-sectional view showing a microwave plasma source according to a first embodiment of the present invention.
Figure 3:
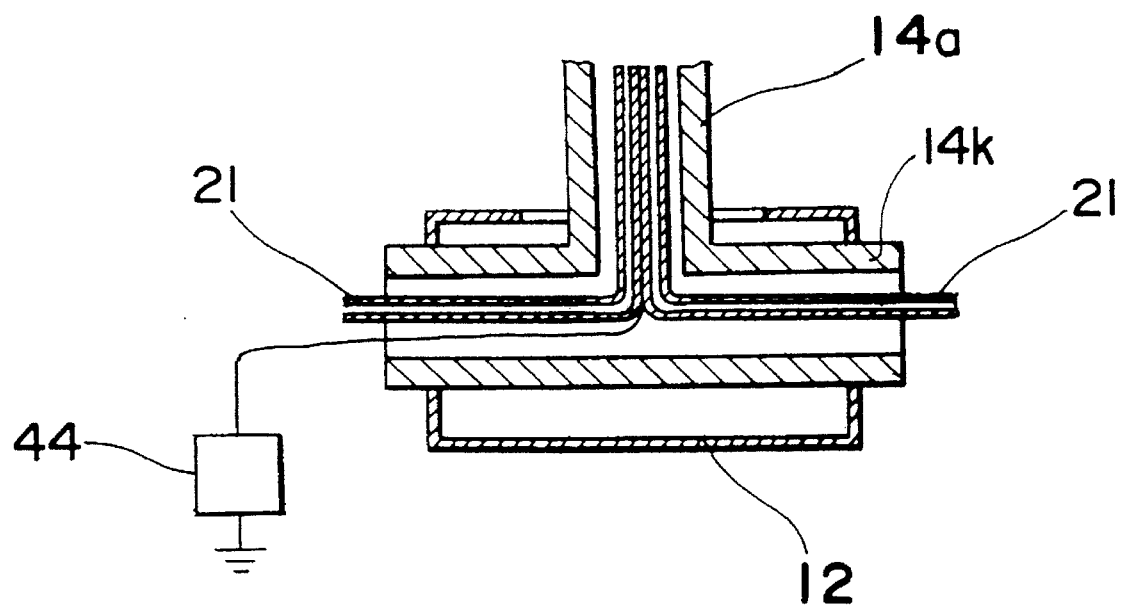
FIG. 3 is a side sectional view of the source in FIG. 1.

In FIG. 1, a microwave plasma source according to d first embodiment of the present invention, comprises a microwave source 11, a rectangular cavity resonator 12 having the microwave source 11, a coaxial tube 14 connected with the resonator 11, a vacuum chamber 24, a target holder 30 for holding a target 19, and a plurality of permanent magnets 18a, 18b, and 18c coaxially arranged in the target holder 30. In FIG. 1, microwaves of, for example, 2.45 GHz generated by the magnetron 11 are led to the rectangular cavity resonator 12 which has a movable short-circuiting plate 13 on one end thereof so as to guide the microwaves to the coaxial tube 14. The movable short-circuiting plate 13 can be moved by moving a plate 43 connected with the plate 13 by a driving cylinder 42. The coaxial tube 14 is constituted by a cylindrical outer conductor 14b and a cylindrical inner conductor 14a which is coaxial with the central axis of the outer conductor 14b. The inner conductor 14a is inserted into the rectangular cavity resonator 12 by a length of ¼ wavelength λ (for example, λ=12.4 cm) in the direction of the electrical field in the resonator 12, with its T-shaped tip end 14k being penetrated through the side faces of the cavity resonator 12, as shown in FIG. 3. The T-shaped tip end 14k extends in a direction perpendicular to a forward direction of the microwave. Through the T-shaped tip end 14k, water cooling pipes 21 connecting with the target holder 30 are led outside the coaxial tube 14. The other end of the coaxial tube 14, that is, each of the other end portions 14c and 14d of the inner and outer conductors 14a and 14b, is formed in a door-knob shape. The other end portion 14c of the inner conductor 14a extends from the other end, i.e., the upper end, of the inner conductor 14a and is gradually enlarged the diameter therefrom. That is, the outer shape of the other end portion 14c is formed by combining a circular truncated cone shape, of which the inclined angle of the cross-sectional shape is 45 degrees, and a cylinder shape so that plasma 15 of a desired size may be obtained at its open end. The inner and outer conductors 14a and 14b each have flat portions 14e and 14f at the ends. The inner and outer flat portions 14e and 14f have openings 14i and 14h. In the flat portion 14e, the target holder 30 is electrically insulated and the permanent magnets 18a, 18b, and 18c are disposed. The permanent magnets 18a, 18b, and 18c are coaxially arranged in the target holder 30 so that the magnets 18a, 18b, and 18c having different poles are adjacent to each other to form a plurality of circular magnetic tunnels 31 and 32 for magnetron discharge on the target holder 30 in the flat portion 14e of the other end portion (the door-knob-shaped portion) 14c of the inner conductor 14a, as shown in FIG. 2. That is, the disk-shaped permanent magnet 18a having a south pole, the inner ring-shaped permanent magnet 18b having a north pole, and the outer ring-shaped permanent magnet 18c having a south pole are coaxially arranged and properly spaced in the target holder 30. The target 19 is supported by the target holder 30 electrically insulated by two Teflon plates 20 ("Teflon" is the trademark for polytetrafluoroethylene and is manufactured by du Pont) from the other end portion 14c, the target holder 30 being arranged at the upper end of the other end portion 14c in FIG. 1. Thus, the target 19 covers the permanent magnets 18a–18c. So that the target 19 and the permanent magnets 18a, 18b, and 18c may be water-cooled, the water cooling pipes 21 are provided within the space formed in the inner conductor 14a. By applying different electric potentials from a power source 44 to the pipes 21, the electric potential of the target 19 can be changed. Between the inner conductor 14a and the outer conductor 14b, a glass annular plate 22 for vacuum sealing and through which the microwaves pass is provided at the root portion of the inclined portion. A flange 23 is provided on the periphery of the other end portion 14d of the outer conductor 14b for installing the coaxial tube 14 on the vacuum chamber 24. The vacuum chamber 24, connecting with the opening 14h of the other end portion 14d of the outer conductor 14b, is provided with a gas inlet port 25 and a gas exhaust port 26. Straight above the opening 14i of the other end portion 14c of the inner conductor 14a through the opening 14h of the outer conductor 14b, there is provided a substrate holder 27 which is mounted on the vacuum chamber 24 to hold a substrate 28 to form a thin film.

In such a construction, microwaves of 2.45 GHz generated by the magnetron 11 are transmitted through the 109 mm×54.5 mm rectangular cavity resonator 12, and by changing the position of the movable short-circuiting plate 13, the impedance is changed and then, the microwave is led to the coaxial tube 14 of, for example, 24 mm inner diameter and 54 mm outer diameter so as to be radiated to the opening 14i of, for example, 150 mm diameter via the glass annular plate 22. In this case, when argon gas, or the like is introduced through the gas inlet port 26 and the gas pressure in the chamber 24 is reduced to $2 \times 10^{-2}$ Torr, electric discharging is started. Furthermore, by properly changing the position of the movable short-circuiting plate 13, the amount of the microwaves is minimized. In this case, the pole of each permanent magnet 18 is set as follows. The surface of the center disk-shaped permanent magnet 18a facing the target 19 has the south pole, the surface of the ring-shaped permanent magnet 18b facing the target 19 has the north pole, and the surface of the ring-shaped permanent magnet 18c facing the target 19 has the south pole. The arrangement of the magnetic field causes the magnetic field (for example, 500G) in parallel with the surface of the target 19 near the surface of the target 19, and causes circular magnetic tunnels 31 and 32 to be formed over the target 19. The electric field caused by microwaves is perpendicular to the surface of the target 19 in the coaxial tube cavity mode. That is, the electric field and the magnetic field cross at right angle over the target 19 to catch with the magnetic tunnels electrons formed in the discharge region. Thus, the magnetron discharge takes place and oxygen plasma of a high density can be generated even under the pressure of $10^{-4}$ Torr. And when −200 V is applied to the pipes 21 from the power source 44, ions in the plasma 15 collide with the target 19. At that time, since the microwaves are discharged from the periphery of the plasma 15, it is easy to consume the energy with the outer magnetic tunnel 31 while the inner magnetic tunnel 32 absorbs the energy enough to maintain the magnetron discharge because of the leakage of microwaves. Therefore, magnetron discharges are generated over the target 19 and the substance is liberated from the target 19 to form a thin film on the substrate 32.

According to the microwave plasma source of the first embodiment, the plural permanent magnets 18a–18c alternatively having the north and south poles are coaxially arranged in the target holder 30 in the other end portion (door-knob-shaped portion) 14c of the inner conductor 14a (adjacent the flat portion 14e to form circular magnetic tunnels 31 and 32 for magnetron discharge over the target 19. Then, it is possible to carry out the magnetron sputtering by the use of a 6-inch target even under the pressure of $2 \times 10^{-4}$ Torr.

The second embodiment of the present invention will be described hereinbelow.

Figure 4:
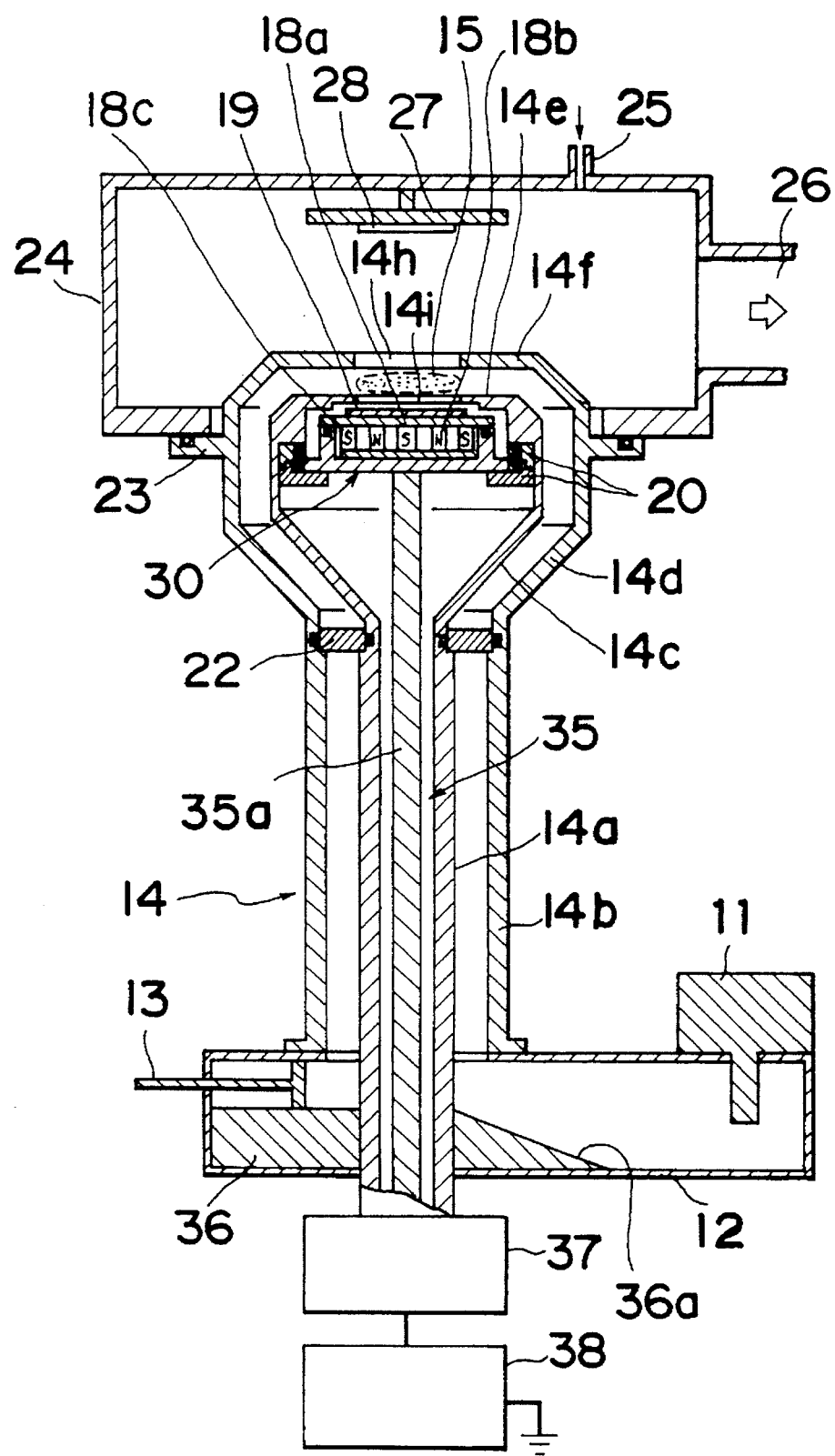
FIG. 4 is a cross-sectional view showing a microwave plasma source according to a second embodiment of the present invention.

In FIG. 4, a microwave plasma source according to the second embodiment comprises the microwave source 11, the rectangular cavity resonator 12 having the microwave source 11, the coaxial tube 14 connected with the resonator 11 and made of, for example, aluminum, the vacuum chamber 24, the target holder 30 for holding the target 19, and the plural permanent magnets 18a, 18b, and 18c coaxially arranged in the target holder 30. In FIG. 4, microwaves of, for example, 2.45 GHz generated by the magnetron 11 are led to the rectangular cavity resonator 12, which has the movable short-circuiting plate 13 on one end thereof so as to guide the microwaves to the coaxial tube 14. The movable short-circuiting plate 13 can be moved by moving the plate 43 connected with the plate 13 by the driving cylinder 42 as mentioned in the first embodiment. The resonator 12 is a ridge waveguide which has a trapezoid iris member 36 having an inclined surface 36a and capable of moving between a portion of the resonator 12 connected with the microwave source 11 and a portion thereof connected with one end of a space formed between the inner conductor 14a and the outer conductor 14b. As shown in FIG. 4, the trapezoid iris member also has a bottom surface supported on a supporting surface of the resonator 12, and a top surface along which the short-circuiting plate 13 is movable and which is parallel to the bottom surface. The coaxial tube 14 is constituted by the cylindrical outer conductor 14b and the cylindrical inner conductor 14a which is coaxial with the central axis of the outer conductor 14b. The inner conductor 14a penetrates through the iris member 36 of the resonator 12 and connects with a matching box 37 and a high-frequency source 38. The other end of the coaxial tube 14, that is, each of the other end portions 14c and 14d of the inner and outer conductors 14a and 14b, is formed in a door-knob shape. The other end portion 14c of the inner conductor 14a is extended from the other end, i.e., the upper end of the inner conductor 14a while is gradually enlarged the diameter thereof. That is, the outer shape of the other end portion 14c is formed by combining circular truncated cone shape, of which the inclined angle of the cross-sectional shape is 45 degrees, and a cylinder shape so that plasma 15 of a desired size may be obtained at its open end. The inner and outer conductors 14a and 14b each have the flat portions 14e and 14f at the ends. The inner and outer flat portions 14e and 14f have the openings 14i and 14h. In the flat portion 14e, the target holder 30 is electrically insulated and the permanent magnets 18a, 18b, and 18c are disposed. The permanent magnets 18a, 18b, and 18c are coaxially arranged in the target holder 30 so that the magnets 18a, 18b, and 18c having different poles are adjacent to each other to form the plural circular magnetic tunnels 31 and 32 for magnetron discharge on the target holder 30 in the flat portion 14e of the door-knob-shaped portion 14c of the inner conductor 14a, as shown in FIG. 2 in the first embodiment. That is, the disk-shaped permanent magnet 18a having the south pole, the inner ring-shaped permanent magnet 18b having the north pole, and the outer ring-shaped permanent magnet 18c having the south pole are coaxially arranged and properly spaced in the target holder 30. The target 19 is supported by the target holder 30 electrically insulated with the two Teflon plates 20 ("Teflon" is the trademark for polytetrafluoroethylene and is manufactured by du Pont) from the other end portion 14c, the target holder 30 being arranged at the upper end of the other end portion 14c in FIG. 4. Then, the target 19 covers the permanent magnets 18a–18c. The inner conductor 14a has a coaxial line 35 for high-frequency and made of, for example, aluminum. An inner conductor 35a of the coaxial line 35 connects with the target holder 30. The coaxial line 35 connects with the matching box 37 and the high-frequency source 38. By applying different high-frequency power to the target holder 30, the electric potential of the target 19 can be changed. Between the inner conductor 14a and the outer conductor 14b, the glass annular plate 22 for vacuum sealing and through which the microwave passes is provided on the root portion of the inclined portion. The flange 23 is provided on the periphery of the other end portion 14d of the outer conductor 14b for installing the coaxial tube 14 on the vacuum chamber 24. The vacuum chamber 24 connecting with the opening 14h of the other end portion 14d of the outer conductor 14b is provided with the gas inlet port 25 and the gas exhaust port 26. Straight above the opening 14i of the other end portion 14c of the inner conductor 14a through the opening 14h of the outer conductor 14b, there is provided the substrate holder 27 which is mounted on the vacuum chamber 24 to hold the substrate 28 to form a thin film.

In such a construction, microwaves of 2.45 GHz generated by the magnetron 11 are transmitted through the 109 mm×54.5 mm rectangular cavity resonator 12 of, and by changing the position of the movable short-circuiting plate 13, the impedance is changed and then, the microwave is led to the coaxial tube 14 of, for example, 24 mm inner diameter and 54 mm outer diameter so as to be radiated to the opening 14i of, for example, 150 mm diameter via the glass annular plate 22. In this case, when argon gas, etc. is introduced through the gas inlet port 26 and the gas pressure in the chamber 24 is reduced to $2\times10^{-4}$ Torr, the electric discharging is started. Furthermore, by properly changing the position of the movable short-circuiting plate 13, the reflected wave of the microwaves is minimized. In this case, the pole of each permanent magnet 18 is set as follows. The surface of the center disk-shaped permanent magnet 18a facing the target 19 has the south pole, the surface of the ring-shaped permanent magnet 18b facing the target 19 has the north pole, and the surface of the ring-shaped permanent magnet 18c facing the target 19 has the south pole. The arrangement of the magnetic field causes the magnetic field (for example, 1000G) in parallel with the surface of the target 19 near the surface of the target 19, and causes the circular magnetic tunnels 31 and 32 are formed over the target 19. The electric field caused by microwaves is perpendicular to the surface of the target 19 in the coaxial tube cavity mode. That is, the electric field and the magnetic field cross at right angles over the target 19 to catch with the magnetic tunnels electrons formed in the discharge region. Thus, the magnetron discharge takes place and argon plasma of a high density can be generated even under the pressure of $10^{-4}$ Torr. And when a high-frequency of 13.5 MHz is applied to the target holder 30 from the high-frequency source 38, ions in the plasma 15 collide with the target 19. At that time, the substance is liberated from the target 19 to form a thin film on the substrate 32.

According to the microwave plasma source of the second embodiment, the plural permanent magnets 18a–18c alternatively having the north and south poles are coaxially arranged in the target holder 30 in the flat portion 14e of the other end portion (door-knob-shaped portion) 14c of the inner conductor 14a to form circular magnetic tunnels 31 and 32 for magnetron discharge over the target 19. Then, it is possible to perform the magnetron sputtering by the use of a 6-inch target even under the pressure of $2\times10^{-4}$ Torr. In the second embodiment, a direct current source instead of the high-frequency source can apply direct current voltage to the target holder.

In the embodiments, the inner and outer conductors can have door-knob shaped portions including cylinder shapes and circular truncated cone shapes, and the inclined angles in the circular truncated cones are inclined between 30 and 60 degrees in cross section.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A microwave plasma source comprising:

a microwave source;

a ridge waveguide having the microwave source coupled thereto;

a coaxial tube connected to the waveguide, the coaxial tube having an outer conductor with an outer doorknob-shaped portion at a first end thereof and an inner conductor having an inner door-knob-shaped portion at a first end thereof, each of the inner and outer door-knob-shaped portions having an opening at an end thereof, the inner conductor being fitted into the waveguide in parallel with a direction of an electric field in the waveguide, and having a flat portion at the end of the inner door-knob-shaped portion, a glass plate for passing the microwave therethrough and for vacuum sealing being arranged between the inner conductor and the outer conductor;

a vacuum chamber connected to the opening of the outer conductor, and provided with a gas inlet port and a gas exhaust port;

a target holder, for holding a target, arranged inside the door-knob-shaped portion of the inner conductor and near the opening thereof and supported by the conductor tube through an electrical insulating member, the target holder including a means for applying high-frequency voltage to the target;

a plurality of permanent magnets coaxially arranged in the target holder so that the magnets having different poles are adjacent to each other to form a plurality of circular magnetic tunnels for magnetron discharge on the flat portion of the door-knob-shaped portion of the inner conductor; and wherein said ridge waveguide comprises a rectangular cavity resonator having a trapezoid iris member mounted therein, said trapezoid iris member having an inclined surface.

2. A microwave plasma source as recited in claim 1, wherein said trapezoid iris member is movably mounted in said rectangular cavity resonator.

3. A microwave plasma source as recited in claim 2, wherein said rectangular cavity resonator is further provided with a movable short-circuiting plate.

4. A microwave plasma source as recited in claim 1, wherein said rectangular cavity resonator is provided with a movable short-circuiting plate.

5. A microwave plasma source as recited in claim 1, wherein said trapezoid iris member has a bottom surface which is supported on a supporting surface in said rectangular cavity resonator such that said inclined surface of said trapezoid iris member is inclined relative to said supporting surface;

said trapezoid iris member further includes a top surface parallel to said bottom surface; and a movable short-circuiting plate is slidably supported for movement along said top surface of said trapezoid iris member.

6. A microwave plasma source as recited in claim 5, wherein said rectangular cavity resonator is elongated along a predetermined direction from a portion thereof at which said microwave source is connected toward a portion thereof at which said coaxial tube is connected; and said movable short-circuiting plate is movable back and forth in said predetermined direction along said top surface of said trapezoid iris member.

7. A microwave plasma source as recited in claim 6, wherein said trapezoid iris member is movably supported on said supporting surface of said rectangular cavity resonator for movement in said predetermined direction.

8. A microwave plasma source comprising:

a microwave source;

a ridge waveguide having the microwave source coupled thereto;

a coaxial tube connected to the waveguide, the coaxial tube having an outer conductor with an outer door-knob-shaped portion at a first end thereof and an inner conductor having an inner door-knob-shaped portion at a first end thereof, each of the inner and outer door-knob-shaped portions having an opening at an end thereof, the inner conductor being fitted into the waveguide in parallel with a direction of an electric field in the waveguide, and having a flat portion at the end of the inner door-knob-shaped portion, a glass plate for passing the microwave therethrough and for vacuum sealing being arranged between the inner conductor and the outer conductor;

a vacuum chamber connected to the opening of the outer conductor, and provided with a gas inlet port and a gas exhaust port;

a target holder, for holding a target, arranged inside the door-knob-shaped portion of the inner conductor and near the opening thereof and supported by the conductor tube through an electrical insulating member, the target holder including a means for applying high-frequency voltage to the target;

a plurality of permanent magnets coaxially arranged in the target holder so that the magnets having different poles are adjacent to each other to form a plurality of circular magnetic tunnels for magnetron discharge on the flat portion of the door-knob-shaped portion of the inner conductor;

wherein said ridge waveguide comprises a rectangular cavity resonator; and wherein a trapezoid iris member and a movable short-circuiting plate are mounted in said rectangular cavity resonator for gradually changing an impedance of said ridge waveguide in a direction from said microwave source toward said coaxial tube.

9. A microwave plasma source as recited in claim 8, wherein said trapezoid iris member has a bottom surface and an inclined surface and is supported on a supporting surface in said rectangular cavity resonator such that said inclined surface of said trapezoid iris member is inclined relative to said supporting surface;

said trapezoid iris member further includes a top surface parallel to said bottom surface; and said movable short-circuiting plate is slidably supported for movement along said top surface of said trapezoid iris member.

10. A microwave plasma source as recited in claim 9, wherein said rectangular cavity resonator is elongated along a predetermined direction from a portion thereof at which said microwave source is connected toward a portion thereof at which said coaxial tube is connected; and said movable short-circuiting plate is movable back and forth in said predetermined direction along said top surface of said trapezoid iris member.

11. A microwave plasma source as recited in claim 10, wherein said trapezoid iris member is movably supported on said supporting surface of said rectangular cavity resonator for movement in said predetermined direction.

* * * * *